United States Patent [19]

Clark

[11] 4,289,382
[45] Sep. 15, 1981

[54] MEASUREMENT SYSTEM FOR MACHINE PARTS

[75] Inventor: Earl S. Clark, Coventry, R.I.

[73] Assignee: Federal Products Corporation, Providence, R.I.

[21] Appl. No.: 107,766

[22] Filed: Dec. 28, 1979

Related U.S. Application Data

[63] Continuation-in-part of Ser. No. 893,353, Apr. 14, 1978, abandoned, and Ser. No. 24,398, Mar. 27, 1979, abandoned.

[51] Int. Cl.³ .............................................. G02F 1/133
[52] U.S. Cl. .............................. 350/331 R; 33/172 E; 340/765
[58] Field of Search .................. 350/331 R, 336, 332; 33/172 E, 166, 174 L; 116/231, DIG. 37; 368/30; 340/180, 384 E, 765, 784

[56] References Cited

U.S. PATENT DOCUMENTS

| | | | |
|---|---|---|---|
| 3,482,323 | 12/1969 | Hamel et al. | 33/172 E |
| 3,619,574 | 11/1971 | Mindheim | 324/99 D |
| 3,696,385 | 10/1972 | Burns | 340/316 |
| 3,772,874 | 11/1973 | Lefkowitz | 350/336 X |

*Primary Examiner*—Edward S. Bauer
*Attorney, Agent, or Firm*—Barlow & Barlow

[57] ABSTRACT

A measurement system that is particularly adapted for the use in machining of parts or measuring finished parts is disclosed. The system includes a support means upon which is movably clamped a casing, the casing having a measuring member extending therefrom that will engage the part that is being machined or measured. On the casing there is mounted a composite indicator that obtains a digital readout as well as an analog dial readout of the same units which allows a user to search for maximum and minimum readings, as well as providing for extended resolution in digital form of the interpolation between two analog scale points on the dial.

1 Claim, 5 Drawing Figures

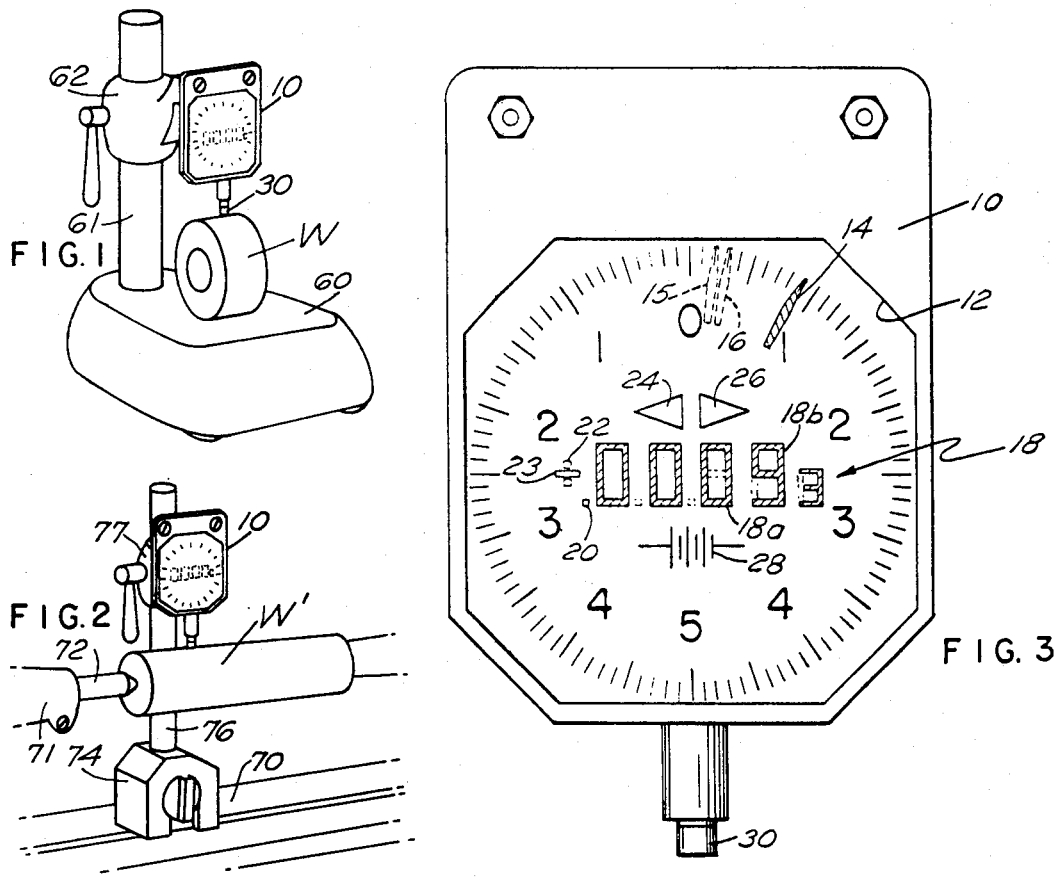
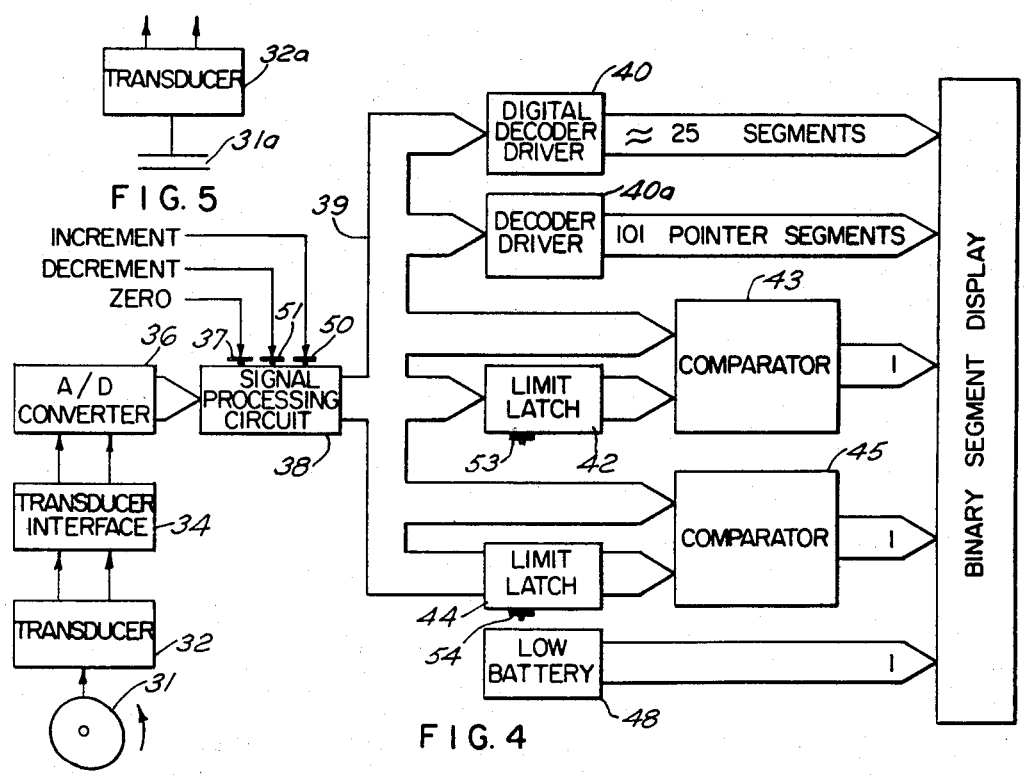

MEASUREMENT SYSTEM FOR MACHINE PARTS

CROSS REFERENCE TO RELATED APPLICATION

This application is a continuation-in-part of my earlier applications, Ser. No. 896,353, filed Apr. 14, 1978, and now abandoned and Ser. No. 024,398, filed Mar. 27, 1979 and now abandoned.

BACKGROUND OF THE INVENTION

This invention relates to a measurement system for machine parts of the type which includes an apparatus for displaying visually an indication of a measurement and particularly to an apparatus that is responsive to an electrical signal that provides a visible display utilizing binary segment devices of one form or another known in the art as devices having at least two optically visible states.

There are in the prior art a number of devices which digitally indicate measurements as, for example, a micrometer as seen in U.S. Pat. No. 3,924,336 and height gages as seen in U.S. Pat. Nos. 3,924,337 and 4,037,325. Devices such as this are fine when a fixed part is to be measured but fall short of the desired result when a part is moving at a high rate for the decimal numerals will be changing so rapidly that they cannot be followed by the eye. This forces the operator to slow the machinery down to a point where he can make a visual indication with some accuracy and/or see the range variation that is occuring.

There are also a number of devices in the prior art that provide visible displays which are representative of various phenomena. For example, there are prior art devices that will display time which have been suggested in Patents such as U.S. Pat. No. 3,772,874. Devices such as this, however, are for purely disclosing time and even when analog indications are combined with digital indication, the analog digital indications are not equivalent one to the other. In the prior art the only disclosure of an analog indication which is identical to the digital indication is contained in U.S. Pat. No. 3,696,385.

SUMMARY OF THE INVENTION

The general aim of the present invention is to provide a measurement system for machine parts which will have a new and improved measurement readout which retains the advantages of a digital display while enabling an increase in the speed and accuracy with which the operator may ascertain the range or variation of the part being machined. The readout which is provided helps reduce operator fatigue, which is achieved by providing a readout which displays measurements in convenient digital form as well as displaying the same sets of units along a circular scale.

The apparatus of the present invention is structured circularly as a quasi-analog display as a distance measurement device. However, the present invention is not so limited and may be embodied in other geometric shapes and for other uses. For example, electrical values may be sensed and displayed. Within the circular arrangement there is provided a digital display which corresponds to the circular quasi-analog display. For convenience in use, additional display segments may be provided as an upper limit segment and lower limit display segment as well as a low battery indicator segment or segments. Through the use of the electronic circuitry associated with the device, the least significant digit in the digital readout serves as a vernier in interpolating between analog segments. To achieve the necessary visual distance measurement indication, the device is provided with a measuring stem which is coupled to a transducer. In other uses the transducer may be coupled to an electrical line. In both cases the transducer produces an analog signal which analog signal is then converted by an analog-to-digital converter. The converter in turn takes the digital pulses and feeds them onto a driver stage where the pulses are converted into drive signals for developing the proper field which is applied to the appropriate segments for displaying the analog signal as well as the digital signal, which is indicative of physical displacement in the present embodiment.

DESCRIPTION OF THE DRAWINGS

FIG. 1 is a perspective view illustrating one use of the indicator of the present invention;

FIG. 2 is a perspective view illustrating another use of the indicator;

FIG. 3 illustrates a measurement indicator;

FIG. 4 is a block schematic diagram showing the manner in which the device of FIG. 3 may operate; and FIG. 5 is a block diagram illustrating the transducer coupled to an electrical line.

DESCRIPTION OF THE PREFERRED EMBODIMENT

As shown in the drawings for the purposes of illustration, the invention is embodied in a measurement system for machine parts. In FIG. 1 there is illustrated a gaging station which is known, for example, as a comparator and which includes a ground base 60 with a vertical column 61 rising from the base. On the column 61 is a mounting attachment 62 to which the case 10 which comprises the indicator is attached. As will be seen by referring to the drawing, the measuring stem 30 of the indicator 10 is engaging a workpiece W which lies on the ground base 60 and may be rolled thereon to give a measurement as the measuring stem 30 engages the periphery thereof.

In FIG. 2 the instant invention is shown in use on a rotating part on a lathe or a similar device which includes a bed 70 and as is usual in a rotating tool there will be rising from the bed a fixture such as 71 that carries a center point such as 72 or the like, a chuck (not shown) being used to drive the rotating part here illustrated as W'. On the bed 70 there is mounted a base 74 which may be of the permanent magnet type that carries an upright post 76 and like the illustration in FIG. 1 there is an attachment member 77 which carries the indicator case 10.

Referring now to FIG. 3, the indicator of the present invention basically is contained within a case 10 which will encompass the electronic circuitry as well as the display segments which will be supported on suitable material such as glass or the like as well known to those skilled in the art. The display which may be seen through a window 12 comprises, for example, one hundred one segments circularly arranged to indicate dial divisions. For ease in illustration one segment 14 is shown in the visible state while two segments 15 and 16 are shown in broken lines to indicate non illuminated or non visible segments. It will be of course understood as well known to those skilled in the art that each of the segments is connected to an electrical lead so that it may be appropriately energized by the electronic driver. Representative scale divisions are provided for each segment which may indicate some form of measurement either in thousandths of an inch, tenths of an inch, appropriate metric system units, volts, millivolts, milliamps, grams, or whatever units corresponding to the variable being measured, and accordingly suitable digits and scale divisions as seen in FIG. 3 are provided.

Within the central area of the circularly arranged segments there is provided appropriate groups of segments for indicating digits as, for example, seven individual segments for each digit, there being illustrated and generally indicated at 18 five such digital display areas. In addition, there are provided at least three decimal point segments as, for example, the decimal point indicated by the reference numeral 20 and two further sets of segments 22 and 23 which will indicate a direction in the form of a plus or a minus as the case might be.

For certain purposes, which are desirable for gaging certain types of devices, means which will indicate when a device is within tolerance are provided, and it is appropriate to be able to put into the devices memory an upper limit of measurement as well as a lower limit of measurement and when these are reached or exceeded, segments such as segments 24 and 26 can be illuminated. Additionally, since the device being portable in nature is battery powered, segments such as 28 are provided to display the symbol of a battery indicating to the user that the battery needs to be replaced. It will be understood, of course, that the segments and the input leads thereto may be formed on the suitable support layer by a variety of methods such as sputtering, evaporation, photo masking or etching and the segments may be made of a suitable transparent electrically-conductive reflective or transparent material depending upon whether the display is operated in a reflective or transmissive mode, all as well known to those skilled in the visible binary segment display art, including such devices as light-emitting diodes, liquid crystals, gas discharge tubes, plasma displays, and so forth.

The display shown in FIG. 3, which is a combination analog display and a digital display, has been particularly structured to provide as an example of the several applications a display for a distance measuring device, which is known in the art as a dial indicator. Dial indicators have long been known in the measuring art and are exemplified as, for example, by the Worthen U.S. Pat. No. 2,484,770. Basically, they have been used to ascertain the value of a variation from a standard or they might be used to measure the eccentricity of a rotating part, such as a part 31 which is being trued in a lathe. The analog display is necessary to search for high and low points in such a situation. These prior art devices are mechanical devices in which magnificiation is obtained with gears and accuracy is necessarily limited and is a direct result of tolerance in the mechanical parts. By using an electrical method, there is only one moving part and no gear nor bearing wear resulting in error in the prior devices. Further, the resistance to shock is excellent. Accordingly, the instant invention utilizes a transducer, and in the mechanical distance measuring version has a measuring stem which is coupled directly to the transducer. The transducer 32 may take a variety of forms but it is preferred to utilize a differential transformer which is well known in the art as consisting of a primary coil, a pair of secondary coils and a core member which is carried by the movable member or measuring stem 30. The primary coil of a differential transformer system is, as well known to those skilled in the art, energized by an oscillator which energizes the primary coil at a frequency say of 5 kHz. The outputs of the secondary coils develop a differential voltage or other analog signal such as a variable inductance that varies as a function of the position of the core member relative to the secondary coils, and this analog signal is then passed through a suitable amplifying transducer interface 34 and thence to an analog-to-digital converter 36 which, for example, could be a Siliconix LD131. This converter generates signals in a coded form representative of the instantaneous amplitude or frequency of the analog signal being evaluated. The signals are then provided to an electronic circuit 38 consisting of logic gates interconnected in a certain prescribed manner enabling their use for carrying out such operations as digital signal comparison, counting, bit incrementing and decrementing and signal power amplification. The circuitry is also designed to accept inputs from switches manually actuated to alter the circuits function. An additional function of the circuit is to provide electrical signal outputs to external computers, signal processors, process control systems, statistical analyzers and the like. The signal processing circuit 38 may use a memory location which will be loaded with the contents of the bus 39 when the zero switch 37 is activated. This number will be subtracted from future readings. The increment switch 50 will cause this stored number to increase at the rate of approximately three numbers per second as long as the switch is held closed. The decrement switch 51 will cause this stored number to decrease at the rate of approximately three numbers per second as long as the switch is held closed.

The circuit 38 will be provided with a bus structure 39 and the bus 39 is connected to decoder driver 40, decoder driver 40a, limit one latch 42, limit two latch 44, and also to a comparator 43 and a comparator 45. Decoder driver 40 provides sufficient voltage for driving approximately 25 segments which represents all of the digits of the digital display 18 and will take a binary coded input from bus 39. Decoder driver 40a takes a binary-coded input from bus 39 and will drive up to 101 segments of the so-called pointer display as seen generally in FIG. 3. The arrangement is such that in the decoder driver 40a it can be said that it is driven from the least significant digit 18b and 18a. Thus, when it reaches zero effectively it will either increment or decrement by one causing a different position to illuminate adjacent to the previously illuminated position. For example, by referring to the drawing, if it increments by one and assuming that 15 was illuminated, then 16 will become illuminated at the time of the increment. The decoder driver 40, however, is responsive to true position on all digits, and thus the fifth digit will operate as what can be termed an interpolated numeral of the analog display or, for example, a grad splitter. As seen in FIG. 1, for example, it will be noticed that the analog display shows by illuminated position 14 the digit 9, while the digital display shows 0.00093, the last digit being effectively the fifth digit on bus 39 to which the decoder driver 40 is responsive, and of course, indicates that the actual position as seen by the transducer 32 is three-tenths of the way between 9 and 10.

Limit latch 42 is used to store a reading by pressing button 53, and it can be readily seen by referring to the drawing that indeed if a reading is stored in latch 42 and the reading is found on the bus 39, then since the comparator 43 is looking at bus 39, the comparator will store an annunciator such as 24 as seen in FIG. 3 on the display. A similar operation occurs for limit latch 44 on the drawings, and this again can store a different reading in an opposite direction by pressing button 54, and when its comparator 45 finds that reading, then it will pulse the other annunciator 26.

For convenience of operation a low battery sensor 48 may be provided which will be sensitive to the battery voltage, and if the battery voltage drops below a preset level will pulse the display 28 and shut down the rest of the system.

Referring to FIG. 5 we have illustrated an alternate transducer 32a as coupled to electric lines 31a, the transducer 32a being sensitive, for example, to voltage current or resistance or any other electrical parameter desired. For example, one can conceive of a situation in which the electrical transducer 32a could also be sensitive to pressure, could indicate force in the form of a strain gage or temperature, and divers other applications limited only by one's imagination. In this embodiment, the disadvantages of the slow response of usual analog meters, due in large measure to the ballistics of the movement, are avoided and, for example, the tuning of resonant circuits may be easily facilitated.

I claim:

1. A measurement system for machine parts comprising a case, a support means for movably clamping the case to the support whereby the position of the case may be varied relative to a machine part, a measuring member extending from said case for engagement with the machine part, said measuring member coupled to a transducer, said case having a configuration with at least one circular face, a plurality of groups of segments disposed in a circle around the periphery of said face, said transducer having an analog output, an analog-to-digital converter, a signal processing circuit, said circuit having an output coupled to a decoder driver for the circular segments and a decoder driver for the digital display, the central portion of said face being provided with an opening, a plurality of binary segments arranged in a predetermined manner within said opening to provide a digital display, a digital display within said opening displaying at least three significant digits, two digits of said display corresponding to the analog reading of the plurality of radially extending segments mounted in the circular pattern on said face, the third digit corresponding to an interpolated numeral of the analog display.

* * * * *